(12) United States Patent
Raju et al.

(10) Patent No.: US 11,094,581 B2
(45) Date of Patent: Aug. 17, 2021

(54) IC STRUCTURE WITH AIR GAPS AND PROTECTIVE LAYER AND METHOD FOR MANUFACTURING THE SAME

(71) Applicant: The Hong Kong University of Science and Technology, Hong Kong (CN)

(72) Inventors: Salahuddin Raju, Singapore (SG); Man Sun John Chan, Hong Kong (CN); Clarissa Cyrilla Prawoto, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 41 days.

(21) Appl. No.: 16/485,993

(22) PCT Filed: Feb. 28, 2018

(86) PCT No.: PCT/CN2018/077546
§ 371 (c)(1),
(2) Date: Aug. 14, 2019

(87) PCT Pub. No.: WO2018/171399
PCT Pub. Date: Sep. 27, 2018

(65) Prior Publication Data
US 2020/0235000 A1    Jul. 23, 2020

Related U.S. Application Data

(60) Provisional application No. 62/601,416, filed on Mar. 22, 2017.

(51) Int. Cl.
*H01L 21/768* (2006.01)
*H01L 23/522* (2006.01)
(Continued)

(52) U.S. Cl.
CPC ........ *H01L 21/7682* (2013.01); *H01L 21/764* (2013.01); *H01L 21/76877* (2013.01);
(Continued)

(58) Field of Classification Search
CPC .......... H01L 21/7682; H01L 21/76877; H01L 23/5329; H01L 23/5226; H01L 2221/1042; H01L 21/764
See application file for complete search history.

(56) References Cited

U.S. PATENT DOCUMENTS 5,863,832 A * 1/1999 Doyle ................. H01L 23/5222
438/622
6,284,621 B1 * 9/2001 Chang ................. H01L 21/7682
257/E21.581
(Continued)

FOREIGN PATENT DOCUMENTS

| CN | 102881643 A | 1/2013 |
|---|---|---|
| CN | 103178002 A | 6/2013 |
| JP | 2008-277437 A | 11/2008 |

OTHER PUBLICATIONS

Shieh et al., "Air-gap formation during IMD deposition to lower interconnect capacitance," in IEEE Electron Device Letters, vol. 19, No. 1, pp. 16-18, Jan. 1998. doi: 10.1109/55.650339.
(Continued)

*Primary Examiner* — Jose R Diaz
(74) *Attorney, Agent, or Firm* — Spruson & Ferguson (Hong Kong) Limited

(57) ABSTRACT

Provided is an integrated circuit structure and a method for manufacturing the same. The integrated circuit structure comprises a substrate; a plurality of interconnecting structures on the substrate, each of the interconnecting structures comprises side surfaces and a top surface, the side surfaces directly define air gaps therebetween isolating the interconnecting structures from each other; and a planar protective
(Continued)

layer on top of the plurality of interconnecting structures covering all of the air gaps. The protective layer comprises a sheltering film and a supporting film.

14 Claims, 2 Drawing Sheets

(51) Int. Cl.
*H01L 21/764* (2006.01)
*H01L 23/532* (2006.01)

(52) U.S. Cl.
CPC ...... *H01L 23/5226* (2013.01); *H01L 23/5329* (2013.01); *H01L 2221/1042* (2013.01)

(56) References Cited

U.S. PATENT DOCUMENTS

| | | | |
|---|---|---|---|
| 6,861,332 | B2 | 3/2005 | Park et al. |
| 7,041,571 | B2 | 5/2006 | Strane |
| 7,253,095 | B2 | 8/2007 | Lur et al. |
| 7,879,683 | B2 | 2/2011 | Al-Bayati et al. |
| 7,928,003 | B2 | 4/2011 | Naik |
| 8,058,138 | B2 | 11/2011 | McGinnis et al. |
| 8,999,839 | B2 | 4/2015 | Su et al. |
| 9,030,016 | B2 | 5/2015 | Purayath et al. |
| 9,349,687 | B1 * | 5/2016 | Gates .............. H01L 21/76834 |
| 2003/0064577 | A1 | 4/2003 | Hsu et al. |
| 2010/0206842 | A1 | 8/2010 | Gu |

OTHER PUBLICATIONS

Chen et al., "A self-aligned air gap interconnect process," 2008 International Interconnect Technology Conference, Burlingame, CA, USA, 2008, pp. 34-36. doi: 10.1109/IITC.2008.4546917.

Fischer et al., "Low-k interconnect stack with multi-layer air gap and tri-metal-insulator-metal capacitors for 14nm high volume manufacturing," 2015 IEEE International Interconnect Technology Conference and 2015 IEEE Materials for Advanced Metallization Conference, Grenoble, 2015, pp. 5-8. doi: 10.1109/IITC-MAM.2015.7325600.

Natarajan et al., "A 14nm logic technology featuring 2nd-generation FinFET, air-gapped interconnects, self-aligned double patterning and a 0.0588 μm2 SRAM cell size," 2014 IEEE International Electron Devices Meeting, San Francisco, CA, 2014, pp. 3.7.1-3.7.3. doi: 10.1109/IEDM.2014.7046976.

Cheng et al., "Air spacer for 10nm FinFET CMOS and beyond," 2016 IEEE International Electron Devices Meeting, San Francisco, CA, 2016, pp. 17.1.1-17.1.4. doi: 10.1109/IEDM.2016.7838436.

International Search Report and Written Opinion of PCT application No. PCT/CN2018/077546 issued from the International Search Authority dated May 25, 2018.

* cited by examiner

IC STRUCTURE WITH AIR GAPS AND PROTECTIVE LAYER AND METHOD FOR MANUFACTURING THE SAME

CROSS-REFERENCE TO RELATED APPLICATIONS

The present application claims priority to and the benefit of U.S. Provisional Patent Application Ser. No. 62/601,416, entitled AIR-GAP STRUCTURE IN INTEGRATED CIRCUITS, which was filed on Mar. 22, 2017, and is hereby incorporated by reference in its entity.

FIELD OF THE INVENTION

The present disclosure generally relates to integrated circuit (IC) structures and methods for manufacturing the same, and in particular, to IC structures with air gaps and a protective layer, and methods for manufacturing the same.

BACKGROUND OF THE INVENTION

The evolution of integrated circuits has led to higher complexity and decreased size. Numerous semiconductor components or devices are packed onto a single small semiconductor substrate. These semiconductor components or devices are typically joined together using interconnecting structures to create an integrated circuit. The interconnecting structures are typically made from conductors, such as copper (Cu), aluminum (Al); or dielectric materials, such as silicon dioxide ($SiO_2$). Electrical isolation between the interconnecting structures is an important and integral part of integrated circuit design for preventing unwanted electrical coupling and cross talking between the adjacent interconnecting structures. Gap structures and dielectric materials are typically positioned between the interconnecting structures for electrical isolation.

The speed of the interconnecting structures can be roughly assumed to be inversely proportional to the product of the line resistance R and the capacitance C (parasitic capacitance) between the interconnecting structures. RC (resistance-capacitance resonant) losses in the wiring levels of the integrated circuits is a significant limiting factor of the final performance of the final semiconductor product. As the integrated circuits scale, the RC delay contributes more to the overall delay of the semiconductor product than the transistor delay. There are further issues such as cross-talking between the interconnecting structures. To improve the final performance of the semiconductor product, it is essential to reduce the RC losses. This can be done by reducing the capacitance C, and more particularly by reducing the dielectric constant (k) of the dielectric material between the interconnecting structures.

However, using low-k dielectric materials, such as pure $SiO_2$ (with a k of 4.2), porous carbon doped silicon oxide (with a k of 2.4 to 2 depending on the porosity), aerogels and polymers, between the interconnecting structures can be problematic. Use of these materials may lead to issues with materials reliability, manufacturability and integration challenges. Air gaps or voids formed between the interconnecting structures address some of the concerns associated with the use of low-k dielectric materials. Air has a low dielectric constant close to 1. It is therefore a suitable low-k dielectric material.

Nevertheless, current techniques employing air gaps have their own concerns. One major issue is the malfunction or even failure of integrated circuits as a result of contamination of the air gaps. The contamination may be from various processes in the manufacture of the IC structure. Some techniques use dielectric materials in forming and enclosing the air gaps. However, residual dielectric materials remaining in the air gaps may still cause contamination. In addition, some techniques forming the air gaps, such as methods sacrificing materials to form air gaps, usually employ many processing steps requiring a long processing time. The removal of such sacrificial materials can also be complex and difficult.

Hence, there is a need for an integrated circuit structure with air gaps to reduce the parasitic capacitance between the interconnecting structures. Further, there is a need to improve such an integrated circuit structure in the art so that the problems inherent in the current structures and manufacture thereof can at least be partly remedied.

SUMMARY OF THE INVENTION

The present disclosure provides for an integrated circuit structure comprising: a substrate; a plurality of interconnecting structures on the substrate, wherein each of the interconnecting structures comprises side surfaces and a top surface and the side surfaces directly define air gaps therebetween isolating the interconnecting structures from each other; and a planar protective layer on top of the plurality of interconnecting structures covering all of the air gaps.

In certain embodiments, the air gaps extend substantially the entire thickness of the interconnecting structures.

In certain embodiments, the air gaps have an aspect ratio in the range of 0.5 to 5.

In certain embodiments, the protective layer is continuous.

In certain embodiments, the protective layer comprises a sheltering film sealing the air gaps to prevent material deposition inside the air gaps.

In certain embodiments, the sheltering film is a planar single-layer or multi-layer structure comprising one or more two-dimensional materials selected from semiconductors, dielectric materials and any combination thereof.

In certain embodiments, the one or more two-dimensional materials of the sheltering film are selected from graphene, hexagonal boron nitride, polyimide, and any combination thereof.

In certain embodiments, the one or more materials of the sheltering film have a Young Modulus greater than 50 Gpa.

In certain embodiments, the protective layer further comprises a supporting film on top of the sheltering film to strengthen the sheltering film.

In certain embodiments, the supporting film is a planar single-layer or multi-layer structure comprising one or more materials selected from insulating materials, semiconductors, conducting materials and any combination thereof.

In certain embodiments, the supporting film is made from aluminum oxide.

In certain embodiments, the interconnecting structures are generally vertically aligned lines, wires, plugs, posts, pillars, or a combination thereof.

In certain embodiments, the interconnecting structures comprise one or more material selected from the group consisting of conductors, semiconductors, dielectric materials, and any combination thereof.

In certain embodiments, the interconnecting structures have an aspect ratio in the range of 0.5 to 5.

The present disclosure provides for a method of manufacturing an integrated circuit structure comprising the steps of: a) providing a substrate; b) creating a plurality of interconnecting structures on the substrate, wherein each of the interconnecting structures comprises side surfaces and a top surface and the side surfaces directly define air gaps therebetween isolating the interconnecting structures from each other; and c) adding a planar protective layer on top of the plurality of interconnecting structures to cover all of the air gaps.

In certain embodiments, wherein the step c) comprises adding a sheltering film atop the plurality of interconnecting structures by: d) depositing the sheltering film on a base; e) coating a holding layer on the sheltering film; f) removing the base from the sheltering film; g) transferring a stack of the holding layer and the sheltering film onto the substrate with the sheltering film atop the interconnecting structures; and h) removing the holding layer from the sheltering film.

In certain embodiments, the steps d) to f) of forming the stack of the holding layer and the sheltering film are performed away from the substrate and the plurality of interconnecting structures.

In certain embodiments, the base is made from a cooper foil or a silicon wafer.

In certain embodiments, the holding layer is made from one or more materials that are dissolvable in organic solutions or decomposable by plasma treatment.

In certain embodiments, the holding layer is made from PMMA.

In certain embodiments, the step e) further comprises baking the holding layer after it is coated on the sheltering film.

In certain embodiments, the step g) comprises positioning the stack of the holding layer and the sheltering film onto the substrate with the sheltering film atop the interconnecting structures, and heating the sheltering film and the interconnecting structures to improve the adhesion between the sheltering f and the top surfaces of the interconnecting structures.

In certain embodiments, the holding layer is a thermal release tape.

In certain embodiments, the step g) comprises positioning the stack of the holding layer and the sheltering film onto the substrate with the sheltering film atop the interconnecting structures, and inserting them between two rollers at mild heat to transfer the sheltering film onto the top surfaces of the interconnecting structures.

In certain embodiments, the sheltering film is a planar single-layer or multi-layer structure comprising one or more two-dimensional materials selected from semiconductors, dielectric materials and any combination thereof.

In certain embodiments, the sheltering film is deposited on the base by chemical vapor deposition, plasma enhanced chemical vapor deposition, low pressure chemical vapor deposition, metal organic chemical vapor deposition, atomic layer deposition, evaporation, plasma vapor deposition or molecular beam epitaxy.

In certain embodiments, the step c) further comprises depositing a supporting film on the sheltering film to strengthen the sheltering film.

In certain embodiments, the supporting film is a planar single-layer or multi-layer structure comprising one or more materials selected from insulating materials, semiconductors, conducting materials and any combination thereof.

In certain embodiments, the supporting film is deposited on the sheltering film by chemical vapor deposition, plasma enhanced chemical vapor deposition, low pressure chemical vapor deposition, metal organic chemical vapor deposition, atomic layer deposition, evaporation, plasma vapor deposition, or molecular beam epitaxy.

In certain embodiments, the steps a) to j) are repeated to create a multi-level integrated circuit structure.

BRIEF DESCRIPTION OF THE DRAWINGS

The present disclosure can be more fully understood from the following detailed description when taken in conjunction with the accompanying drawings, in which.

DETAILED DESCRIPTION OF THE INVENTION

For the purposes of the present disclosure, a single-level IC structure with air gaps between interconnecting structures and a protective layer atop the interconnecting structures is illustrated. It should be appreciated the configuration and use of the structure are not intended to be limited as such. For instance, with proper modification, the air gaps and protective layer can be equally applied to a multi-level IC structure. Further, although the present disclosure generally describes forming air gaps between the interconnecting structures and measures sheltering or protecting the air gaps, the air-gaps can be equally provided between non-interconnecting features or between interconnecting features and non-interconnecting features, and the sheltering or protecting measures can equally apply thereto. Other modifications without departing from the spirit and virtue of the present disclosure are therefore also within the scope of the present disclosure.

Additionally, to assist in the description of the structural configuration, words such as top, atop, vertical, width, thickness and the like are used. Unless their contextual usage indicates otherwise, these words are to be understood herein as having no structural, functional or operational significance and as merely reflecting the arbitrarily chosen orientation.

Structural Configuration of the Integrated Circuit Structure

Figure 1:
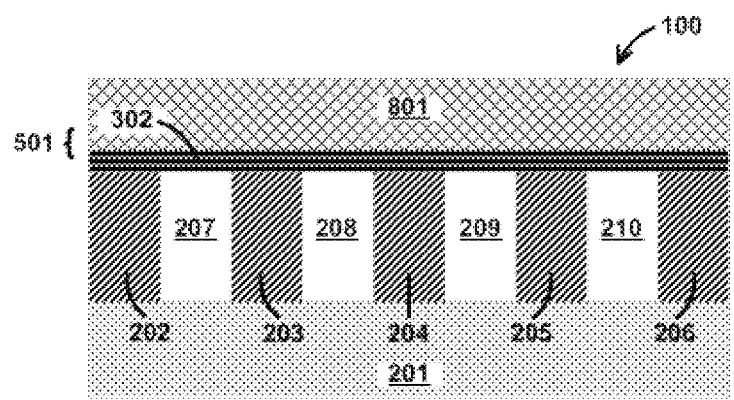
FIG. 1 is a cross-sectional illustration of an integrated circuit structure in accordance with certain embodiments of the present disclosure.
Figure 2:
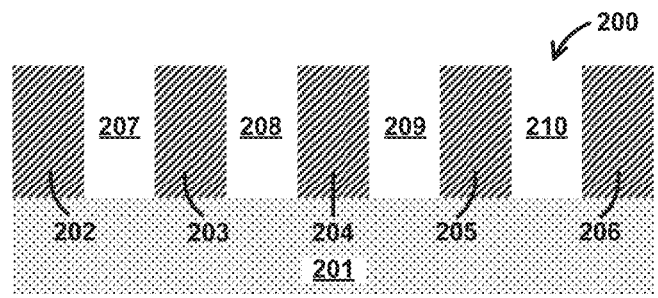
FIG. 2 is a cross-sectional illustration of a substrate having a plurality of interconnecting structures thereon in accordance with certain embodiments of the present disclosure.

An integrated circuit structure 100 according to certain embodiments of the present disclosure is shown in FIG. 1.

The integrated circuit structure 100 comprises a substrate 201, a plurality of interconnecting structures 202, 203, 204, 205 on the substrate 201, and a protective layer 501 atop the interconnecting structures 202-205.

An improvement of the present disclosure lies in that no low-k dielectric material other than air is provided in the gaps 207, 208, 209, 210 (hereafter also referred to as air gaps) defined between the adjacent interconnecting structures 202-205. As air has a low dielectric constant close to 1, it effectively isolates the adjacent interconnecting structures 202-205, even for interconnecting structures 202-205 with a high aspect ratio. The method of manufacture is also greatly simplified, as described below.

The term "substrate" throughout the present disclosure, unless the context indicates otherwise, is intended to denote any surface generated when making an integrated circuit. When reference is made to a substrate herein, certain unspecified process steps may have been utilized to form devices, regions or junctions in the substrate. As a result, the substrate can have one or more layers that include various conductors (e g. metals and alloys), semiconductors, dielectrics, insulators, etc. For example, the substrate can comprise conductors, such as metals and alloys, to form one or more conductive layers on the substrate. The substrate can comprise active and passive devices that are formed thereon, such as transistors, capacitors, resistors, diffused injunctions, gate electrodes, local interconnects, etc. The substrate can also comprises insulating materials, such as silicon dioxide either doped or undoped with phosphorus or boron and phosphorus, silicon nitride, silicon oxynitride and polymer, that separate the active and passive devices from the conductive layer or layers that are formed adjacent them.

In certain embodiments, the term "substrate" can refer to any construction having semiconductive material, which, by way of example and not by way of limitation, can include bulk semiconductive materials, such as a semiconductive wafer (e.g., alone or in assemblies including other materials thereon), and semiconductive material layers (e.g., alone or in assemblies including other materials). In certain embodiments, the construction includes any semiconductor-based structure that has an exposed silicon surface. Such structure can include silicon-on insulator (SOI), silicon-on sapphire (SOS), doped and undoped semiconductors, and/or epitaxial layers of silicon supported by a base semiconductor foundation, among other semiconductor structures. In addition, the semiconductor needs not be silicon-based. The semiconductor can, in various embodiments, be silicon-germanium, germanium, and/or gallium-arsenide, among other compounds.

The term "interconnecting structure" throughout the present disclosure, unless the context indicates otherwise, is intended to denote any conductive element that is used to transport electrical current between interconnects, such as various components and devices associated with the integrated circuit.

In certain embodiments, each of the interconnecting structures 202-206 has a height allowing it to project from the substrate 201. The interconnecting structures 202-206 may assume any appropriate configuration, such as generally vertically extending lines, wires, plugs, posts, pillars, etc., so long as it achieves the interconnecting function. Each interconnecting structure 202-206 defines side surfaces and a top surface. The dimension of the interconnecting structures 202-206 may vary with the feature size of the microelectronic structures of the IC structure 100 and may be different for the various interconnecting structures 202-206. In certain embodiments, the interconnecting structure 202-206 has a width between about 5 nm to about 5,000 nm, between about 50 nm to about 2,500 nm, between about 200 nm to about 1,500 nm, or between about 500 nm to about 1,000 nm. In certain embodiments, each of the interconnecting structures 202-206 has a thickness between about 10 nm to about 5,000 nm, between about 200 nm to about 2,500 nm, or between 500 nm to about 1,000 nm. The thicknesses of various interconnecting structures 202-206 can be the same or different. In certain embodiments, each of the interconnecting structures 202-206 has an aspect ratio (width-to-thickness ratio) in a range of 0.5 to 5, a range of 1 to 4, or a range of 2 to 3.

In certain embodiments, e.g. where the IC structure 100 is applied to back-end-of-line (BEOL) IC manufacturing, the interconnecting structures 202-206 may be formed from one or more conductors (e.g. metals or alloys), such as copper (Cu), aluminum (Al), tantalum (Ta), tungsten (W), titanium (Ti), tantalum nitride (TaN), tungsten nitride (WN), titanium nitride (TiN), and any combination thereof. In certain embodiments, e.g. where the IC structure 100 is applied to front-end-of-line (FEOL) IC manufacturing, the interconnecting structures 202-206 may be formed from one or more semiconductors, such as doped polysilicon or silicide, e.g., silicide comprising tungsten (W), titanium (Ti), Nickel (Ni) or cobalt (Co). In certain embodiments, the interconnecting structures 202-206 can be formed from dielectric materials, such as silicon nitride (SiN), silicon carbide (SiC), silicon dioxide ($SiO_2$), carbon doped oxides, and any combination thereof. In certain embodiments, the interconnecting structures 202-206 can be formed from a combination of any two or more of conductors, semiconductors and dielectric materials.

The interconnecting structures 202-206 define therebetween air gaps 207-210 directly. There are no other materials or structures between the interconnecting structures 202-206 besides air. In particular, there are generally no residual solid or liquid materials from earlier processes (e.g. lithography or etching) between the interconnecting structures 202-206, unless such materials are intentionally left in the air gaps 207-210. In other words, there is only air between the interconnecting structures 202-206. As a result, the air functions as the only dielectric material and the interconnecting structures 202-206 are effectively isolated from each other by the air gaps 207-210 therebetween. As shown in FIG. 1, the air gaps 207-210 are formed directly between side surfaces of the interconnecting structures 202-206, as a result of the creation of the interconnecting structures 202-206 rather than by way of using additional low-k dielectric materials. The dimension of the air gaps 207-210 may vary with the feature size of the microelectronic structures of the IC structure 100 and may vary between the various air gaps 207-210. In certain embodiments, the air gap 207-210 has a width between about 2 nm to about 5,000 nm, between about 20 nm to about 3,000 nm, between about 50 nm to about 1,000 nm, between about 200 nm to about 600 nm, or between about 300 nm to about 500 nm. The air gaps 207-210 extend substantially the entire thickness of the interconnecting structures 202-206. In certain embodiments, the air gaps 207-210 extend approximately 100% of the entire thickness of the n connecting structures 202-206. In certain embodiments, the air gaps 207-210 extend 85% to 100%, 88% to 98%, 90% to 96%, or 92% to 94% of the entire thickness of the injecting structures 202-206. In certain embodiments, the air gaps 207-210 intentionally extend a lower percen g of the entire thickness of the connecting structures 202-206. The thicknesses of various air gaps 207-210 can be the same or different. In certain embodiments, each of the air gaps 207-210 has an aspect ratio (width-to-thickness ratio) in a range of 0.5 to 5, a range of 1 to 4, or a range of 2 to 3. As a result, the interconnecting structures 202-206 can be more effectively isolated.

The protective layer 501 lies atop the interconnecting structures 202-206 and covers the air gaps 207-210. In certain embodiments, the protective layer 501 effectively seals the air gaps 207-210. In certain embodiments, the protective layer 501 comprises a sheltering film 302 on the top surfaces of the interconnecting structures 202-206. The sheltering film 302 is pre-fabricated and transferred to lie on the top surfaces of the interconnecting structures 202-206. In certain embodiments, the sheltering film 302 is continuous so that it covers most or all of the air gaps 207-210. In certain embodiments, the sheltering film 302 is patterned so that it covers all or a selected number of air gaps 207-210. The sheltering film 302 protects the air gaps 207-210 from external materials that may otherwise fall inside or deposit in the air gaps 207-210. The external materials include any undesired matters that may otherwise fall inside or deposit in the air gaps 207-210 either in the manufacturing processes or during use of the IC structure 100. Examples of such external materials include silicon dioxide ($SiO_2$), silicon nitride (SiN), organosilicate (SiOCH), fluorine-doped silicon glass (FSG) and polymers. It is particularly advantageous of the present disclosure that the sheltering film 302 is capable of covering all air gaps 207-210 between the interconnecting structures 202-206 on the substrate 201, so that no single air gap may be particularly vulnerable to external contamination. In addition, the entire substrate 201 where the sheltering film 302 covers can be made full use of without worrying about RC delay peak at a particular location. The sheltering film 302 can be a single-layer structure or a multiple-layer structure made from semiconductors, dielectric materials or any combination thereof. In certain embodiments, the sheltering film 302 is made from one or more materials having a high Young Modulus for it to be mechanically strong. The Young Modulus of materials can be greater than 50 GPa. In certain embodiments, the sheltering film 302 is made from one or more two-dimensional materials, such that it is capable of being transferring to atop the interconnecting structures 202-206 after it is produced elsewhere. In certain embodiments, the sheltering film 302 is made from graphene, hexagonal boron nitride (h-BN), polyimide, a combination of two or more of graphene, h-BN and polymide, or a combination of boron nitride (BN) particularly h-BN aluminum oxide ($Al_2O_3$) and silicon dioxide ($SiO_2$). Any other two-dimensional materials that facilitate transfer of the sheltering film 302 to the interconnecting structures 202-206 are also possible and within the contemplation of the present disclosure. In certain embodiments, the sheltering film 302 has a thickness of around 0.3 nm to 50 nm, around 5 nm to 40 nm, or around 10-30 nm. The thickness of the sheltering film 302 or the number of layers of the sheltering film 302 is largely positively correlated with the width of the air gaps 207-210. As the width of the air gaps 207-210 increases, so will the thickness of the sheltering film 302 or the number of layers of the sheltering film 302.

In certain embodiments, the sheltering film 302 is a planar membrane atop the interconnecting structures 202-206. The membrane has a smooth surface. In certain embodiments, as the spacing between the interconnecting structures 202-206, i.e. the width of the air gaps 207-210, is relatively large, e.g. when the width is close to or larger than 5 µm, the sheltering film 302 may sag in between the interconnecting structures 202-206. However, the effect of sagging is minuscule in view of the scaled IC structure. Therefore, its effect on the dielectric constant is negligible.

In certain embodiments, the protective layer further comprises a supporting film 801 on top of the sheltering film 302. The supporting film 801 is meant to enhance the mechanical strength of the sheltering film 302 so that it can sustain the rigor of the following processes, e.g. chemical mechanical polishing. The supporting film 801 can be a single-layer structure or a multiple-layer structure made from insulating materials, semiconductors, conducting materials, or a combination thereof. In certain embodiments, the supporting film 801 is made from one or more materials having a high Young Modulus for it to be mechanically strong. In certain embodiments, the supporting film 801 is made from one or more materials that allow layer-by-layer deposition (e.g. deposition by each atomic layer) on the sheltering film 302. In certain embodiments, the supporting film 801 can be made from aluminum oxide ($Al_2O_3$). In certain embodiments, the supporting film 801 can be made from the same material that ms the sheltering film 302. The supporting film 801 generally has a spread that is similar or identical to the sheltering film 302. In certain embodiments, the supporting film 801 has a thickness larger than that of the sheltering film 302. In certain embodiments, the supporting film 801 has a thickness between 30 nm to 5,000 nm, between 200 nm to 2,500 nm, between 500 nm to 1,000 nm or between 600 nm to 800 nm.

The protective layer 501 including the sheltering film 302 and preferably also the supporting film 801 protects the air gaps 207-210 as the low-k dielectric material between the interconnecting structures 202-206, so that the air gaps 207-210 will not be contaminated by external undesired materials. As a result, the risks of malfunction or failure of integrated circuits due to contamination of such air gaps 207-210 can be minimized. This structural arrangement also facilitates manufacture by dispensing with complicated steps such as material deposition or sacrifice associated with air gaps formation in the prior art.

Method for Manufacturing the Integrated Circuit Structure

FIGS. 2-8 illustrate the method of manufacturing the IC structure 100 with air gaps 207-210 and a protective layer 501. The method has a bottom-up approach. A substrate 201 as described above is provided, and a plurality of interconnecting structures 202-206 are created on the substrate 201 as shown in step 200 of FIG. 2. The interconnecting structures 202-206 can be created in various ways. In certain embodiments, the interconnecting structures 202-206 can be created by deposition of a planar metal or other composing material followed by a lithography process which patterns a masking layer, and then etching away the unpatterned material. Alternatively, the interconnecting structures 202-206 can be created with a damascene process, in which a metal pattern is created in a base dielectric, and the base dielectric is then etched away exposing the patterned metal. These methods are well known in the art d are therefore not discussed in detail herein.

The creation of the interconnecting structures 202-206 leads to the formation of a plurality of air gaps 207-210 therebetween. It is an advantage of the present disclosure that no additional steps are required in forming the air gaps 207-210. In addition, the processes employed in the present disclosure for creating the interconnecting structures 202-206 generally do not cause any residuals to remain in the air gaps 207-210 therebetween. As a result, the risk of residual materials remaining in the air gaps 207-210 is minimized, and there is no need of extra steps to remove any residuals.

Figure 3:
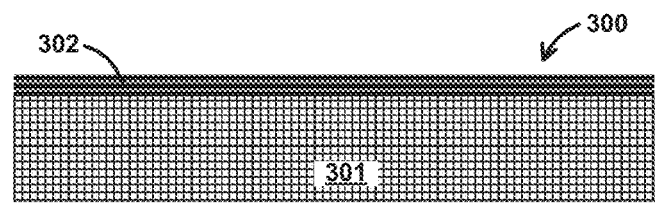
FIG. 3 is a cross-sectional illustration of a base on which a sheltering, film is grown or deposited in accordance certain embodiments of the present disclosure.
Figure 4:
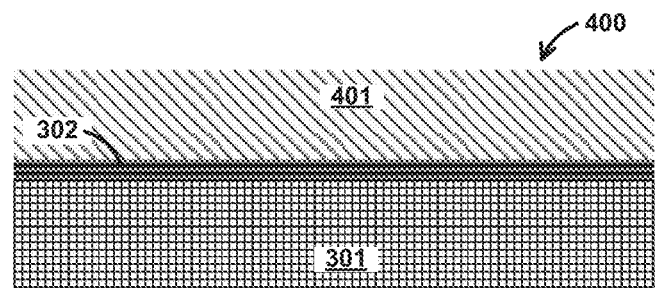
FIG. 4 is a cross-sectional illustration of the structure of FIG. 3 with a holding layer on the sheltering film in accordance with certain embodiments of the present disclosure.
Figure 5:
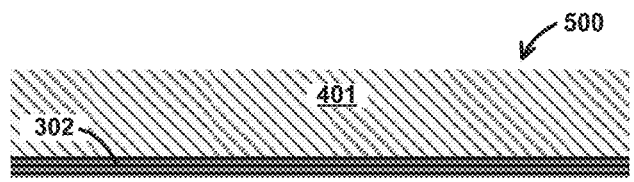
FIG. 5 is a cross-sectional illustration of the structure of FIG. 4 with the base removed in accordance with certain embodiments of the present disclosure.

FIGS. 3-5 show the formation of the protective layer 501, particularly the sheltering film 302 of the protective layer 501. The formation of the sheltering film 302 is a process independent of creation of the interconnecting structures 202-206. As a result, the process can be performed concurrently with creation of the interconnecting structures 202-206, and at a location away from the interconnecting structures 202-206, thereby expediting the entire manufacture and avoiding contamination of the air gaps 207-210. It also avoids any contamination to the air gaps 207-210 from the process. The sheltering film 302 can be grown or deposited on a base 301, as shown in step 300 of FIG. 3. The base is selected according to the material(s) used to form the sheltering film 302 and the growth condition thereof. Where the sheltering film 302 is made of two-dimensional materials such as graphene and h-BN, the base 301 may be made from copper foil or silicon wafer. The growing or deposition process can be done by any one or more of chemical vapor deposition (CVD), such as plasma enhanced chemical vapor deposition (PEVCD), low pressure chemical vapor deposition (LPCVD) and metal organic chemical vapor deposition (MOCVD); atomic layer deposition (ALD); evaporation; plasma vapor deposition (PVD), molecular beam epitaxy (MBE) or any other methods suitable for growing or depositing two-dimensional materials. Where the sheltering film 302 comprises multiple layers, they may be grown or deposited gradually. The deposited sheltering film 302 is then coated with a holding layer 401, as shown in step 400 of FIG. 4.

The holding layer 401 can be made from materials that can be dissolved in organic solutions, such as acetone, or materials that can be decomposed by plasma treatment (e.g. $O_2$ plasma, particularly at 300 W, 70° C. and 280 mTorr for 2 minutes). In certain embodiments, the holding layer 401 can be made from PMMA. The holding layer 401 can be coated onto the sheltering film 302 by any suitable process, such as spin coating, spray coating, dip coating, etc. To increase the adhesion between the holding layer 401 and the sheltering film 302, an assembly of the holding layer 401, the sheltering film 302 and the base 301 can be baked mildly subsequent to the coating so as to harden the holding layer 401. In certain embodiments, the sheltering film 302 and the base 301 are baked at 120° C. and 1 atm for 15 minutes. The mild treatment generally will not deteriorate the performance of the IC structure 100 as it is done under a low temperature. The holding layer 401 and the sheltering film 302 can then be separated from the base 301, e.g. by means of dissolving the base 301 or by mechanical exfoliation, as shown in step 500 of FIG. 5. In certain embodiments where the base 301 is formed from copper foil, it can be dissolved by hydrogen peroxide and sulphuric acid ($H_2O_2$—$H_2SO_4$) which do not react with the holding layer 401 and the sheltering film 302. This leaves a stack of the holding layer 401 and the sheltering film 302.

Figure 6:
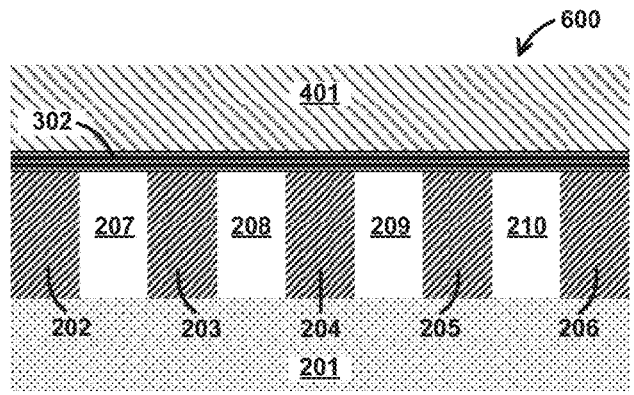
FIG. 6 is a cross-sectional illustration of the structure of FIG. 2 having the structure of FIG. 5 transferred thereon in accordance with certain embodiments of the present disclosure.
Figure 7:
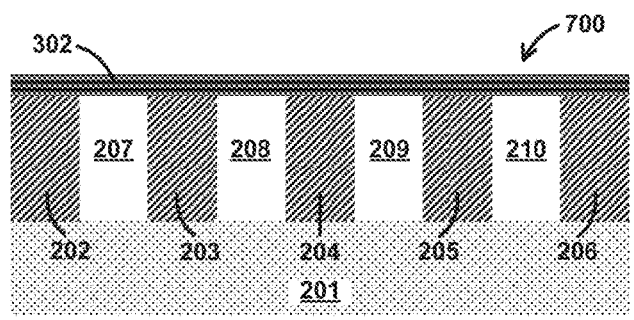
FIG. 7 is a cross-sectional illustration of the structure of FIG. 6 with the holding layer removed in accordance with certain embodiments of the present disclosure.

The remaining stack of holding layer 401 and sheltering film 302 can then be transferred onto the substrate 201 atop the interconnecting structures 202-206 to cover or seal the air gaps 207-210, as shown in step 600 of FIG. 6. In certain embodiments, the stack of holding layer 401 and sheltering film 302 are physically positioned to rest on the interconnecting structures 202-206. The entire structure, particularly the sheltering film 302 and the interconnecting structures 202-206, then goes through a thermal treatment, such as under a temperature of 120° C.-200° C. for 3-10 minutes, e.g. at 180° C. for 5 minutes, to improve the adhesion between the sheltering film 302 and the top surfaces of the interconnecting structures 202-206. As a result, the sheltering film 302 stays in sealed contact with the interconnecting structures 202-206 so that it effectively protects the air gaps 207-210 from external contamination. The holding layer 401 can then be removed from the stack, e.g. by dissolving the holding layer 401 in an organic solution or by oxygen plasma, as shown in step 700 of FIG. 7. In certain embodiments where the holding layer 401 is made from PMMA, it may be dissolved by acetone which does not react with the sheltering film 302.

In certain embodiments, the holding layer 401 is a thermal release tape. Having formed the stack of the thermal release tape and the sheltering film 302, it is transferred onto the substrate 201 atop the interconnecting structures 202-206, and the entire structure is inserted between two rollers at mild heat (e.g. between 90° C. and 120° C.), such that the sheltering film 302 can be transferred from the thermal release tape onto the interconnecting structures 202-206. The thermal release tape can be removed thereafter. Other suitable transfer methods are also possible and within the contemplation of the present disclosure.

Figure 8:
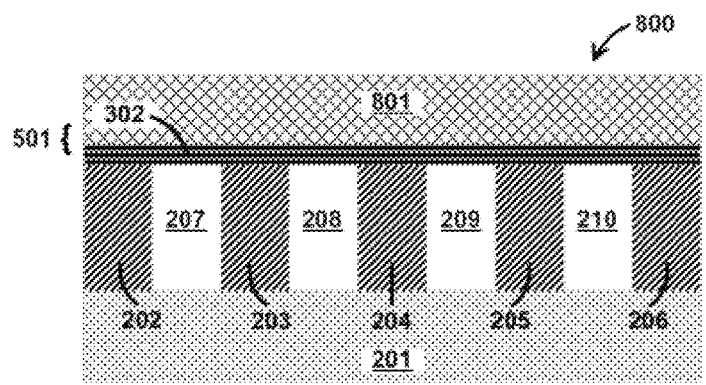
FIG. 8 is a cross-sectional illustration of structure of FIG. 7 with an additional supporting film on the sheltering film in accordance with certain embodiments of the present disclosure.

In certain embodiments, a further supporting film 801 can be coated onto the sheltering film 302, as shown in step 800 of FIG. 8. The supporting film 801 can be coated, e.g. by means of chemical vapor deposition (CVD), such as plasma enhanced chemical vapor deposition (PEVCD), low pressure chemical vapor deposition (LPCVD) and metal organic chemical vapor deposition (MOCVD); atomic layer deposition (ALD); evaporation; plasma vapor deposition (PVD), molecular beam epitaxy (MBE) or any other suitable method. The thickness of the supporting film 801 can largely be controlled by the time of the coating process. Where the supporting film 801 comprises multiple layers, they may be coated gradually. The separate depositions of the sheltering film 302 and the supporting film 801 make the thickness of each film reasonably small to avoid too much stress accumulation within each film as a result of deposition.

By repeating the above steps, it is possible to produce a multi-level IC structure, where each level can have air gaps 207-210 between interconnecting structures 202-206 and a protective layer 501 atop the interconnecting structures 202-206 and the air gaps 207-210. Different levels of the IC structure can be the same or different. Other steps forming the IC structure 100 may follow, but they are not addressed in the present disclosure in detail.

The manufacturing method of the present disclosure is advantageous in many ways over the existing methods for forming air gaps in IC structures. No additional materials such as low-k dielectric materials are necessary for forming the air gaps 207-210. Therefore the air gaps 207-210 can occupy as much space between the interconnecting structures 202-206 as possible. This means a lower dielectric constant between and more effective isolation of the interconnecting structures 202-206. In certain embodiments, simulations show up to 40% improvement in terms of air gaps volume and parasitic capacitance reduction, as compared with air gaps fabricated using non-conformal deposition which results in deposition of dielectric materials on sidewalls of the interconnecting structures. In addition, no additional steps such as deposition, sacrifice and high temperature treatment are necessary for forming the air gaps 207-210 and having the air gaps sufficiently protected. This usually means less complexity and lower costs for the entire process, shorter manufacture duration, and no temperature tradeoff (e.g. there is no circumstance the temperature will go up to 450° C.). The manufacturing method is therefore considerably simplified. Also, the formation of the protective layer 501, particularly the sheltering film 302 is done independently from the substrate 201 and the interconnecting structures 202-206. Hence, there will not be any issue of cross contamination.

While the IC structure 100 and method for manufacturing such structure are set forth here in the context of accompanying drawings, it should be mentioned that the invention is not limited to the specific form shown here. The present invention may be implemented with various changes and substitutions to the exemplified embodiments without departing from the spirit and virtue of the present disclosure, especially the selection of materials and the manufacturing processes can be varied depending on the application of the IC structure. Therefore, the scope of protection of the present disclosure is only intended to be limited by the appended claims.

The invention claimed is:

1. A method of manufacturing an integrated circuit structure comprising the steps of:
   a) providing a substrate;
   b) creating a plurality of interconnecting structures on the substrate, wherein each of the interconnecting structures comprises side surfaces and a top surface and the side surfaces directly define air gaps therebetween isolating the interconnecting structures from each other; and
   c) adding a planar protective layer on top of the plurality of interconnecting structures to cover all of the air gaps;
   wherein the step c) comprises adding a sheltering film atop the plurality of interconnecting structures by:
   d) depositing the sheltering film on a base;
   e) coating a holding layer on the sheltering film;
   f) removing the base from the sheltering film;
   g) transferring a stack of the holding layer and the sheltering film onto the substrate with the sheltering film atop the interconnecting structures; and
   h) removing the holding layer from the sheltering film.

2. The method of claim 1, wherein the steps d) to f) of forming the stack of the holding layer and the sheltering film are performed away from the substrate and the plurality of interconnecting structures.

3. The method of claim 1, wherein the base is made from a copper foil or a silicon wafer.

4. The method of claim 1, wherein the holding layer is made from one or more materials that are dissolvable in organic solutions or decomposable by plasma treatment.

5. The method of claim 4, wherein the holding layer is made from PMMA.

6. The method of claim 4, wherein step e) further comprises baking the holding layer after it is coated on the sheltering film.

7. The method of claim 4, wherein the step g) comprises positioning the stack of the holding layer and the sheltering film onto the substrate with the sheltering film atop the interconnecting structures, and heating the sheltering film and the interconnecting structures to improve the adhesion between the sheltering film and the top surfaces of the interconnecting structures.

8. The method of claim 1, wherein the holding layer is a thermal release tape.

9. The method of claim 8, wherein the step g) comprises positioning the stack of the holding layer and the sheltering film onto the substrate with the sheltering film atop the interconnecting structures, and inserting them between two rollers at mild heat to transfer the sheltering film onto the top surfaces of the interconnecting structures.

10. The method of claim 1, wherein the sheltering film is a planar single-layer or multi-layer structure comprising one or more two-dimensional materials selected from semiconductors, dielectric materials and any combination thereof.

11. The method of claim 1, wherein the sheltering film is deposited on the base by chemical vapor deposition, plasma enhanced chemical vapor deposition, low pressure chemical vapor deposition, metal organic chemical vapor deposition, atomic layer deposition, evaporation, plasma vapor deposition, or molecular beam epitaxy.

12. The method of claim 1, wherein the step c) further comprises depositing a supporting film on the sheltering film to strengthen the sheltering film.

13. The method of claim 12, wherein the supporting film is a planar single-layer or multi-layer structure comprising one or more materials selected from insulating materials, semiconductors, conducting materials and any combination thereof.

14. The method of claim 12, wherein the supporting film is deposited on the sheltering film by chemical vapor deposition, plasma enhanced chemical vapor deposition, low pressure chemical vapor deposition, metal organic chemical vapor deposition, atomic layer deposition, evaporation, plasma vapor deposition, or molecular beam epitaxy.

* * * * *